US007330084B2

(12) United States Patent
Lee et al.

(10) Patent No.: US 7,330,084 B2
(45) Date of Patent: Feb. 12, 2008

(54) PRINTED CIRCUIT BOARD HAVING A BOND WIRE SHIELD STRUCTURE FOR A SIGNAL TRANSMISSION LINE

(75) Inventors: Hee-Seok Lee, Gyeonggi-do (KR); Kyung-Lae Jang, Gyeonggi-do (KR); Tae-Je Cho, Gyeonggi-do (KR); Ki-Won Choi, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/296,769

(22) Filed: Dec. 6, 2005

(65) Prior Publication Data

US 2006/0119448 A1 Jun. 8, 2006

(30) Foreign Application Priority Data

Dec. 7, 2004 (KR) ...................... 10-2004-0102368

(51) Int. Cl.
*H01P 3/08* (2006.01)

(52) U.S. Cl. ........................... 333/4; 333/238; 333/246

(58) Field of Classification Search ................ 333/238, 333/246, 4, 5

See application file for complete search history.

(56) References Cited

U.S. PATENT DOCUMENTS

| | | | | |
|---|---|---|---|---|
| 5,194,833 | A * | 3/1993 | Dougherty et al. | 333/33 |
| 5,942,957 | A * | 8/1999 | Mohwinkel et al. | 333/128 |
| 6,259,337 | B1 * | 7/2001 | Wen | 333/246 |
| 6,867,668 | B1 * | 3/2005 | Dagostino et al. | 333/246 |

FOREIGN PATENT DOCUMENTS

| | | |
|---|---|---|
| JP | 8-242078 | 9/1996 |
| KR | 2001-27014 | 4/2001 |
| KR | 2002-44999 | 6/2002 |

OTHER PUBLICATIONS

English language abstract of Korean Publication No. 2001-27014.
English language abstract of Korean Publication No. 2002-44999.
English language abstract of Japanese Publication No. 8-242078.

* cited by examiner

*Primary Examiner*—Benny Lee
(74) *Attorney, Agent, or Firm*—Marger Johnson & McCollom, P.C.

(57) ABSTRACT

A printed circuit board for a high-speed semiconductor package uses bonding wires as a shield structure, e.g., to shield an open portion of signal transmission lines, and thereby reduce the likelihood of coupling noises, e.g., between signal transmission lines.

32 Claims, 4 Drawing Sheets

25
22
26
20
23
24
21

PRINTED CIRCUIT BOARD HAVING A BOND WIRE SHIELD STRUCTURE FOR A SIGNAL TRANSMISSION LINE

CROSS REFERENCE TO RELATED APPLICATIONS

This U.S. non-provisional application claims benefit of priority under 35 U.S.C. §119 of Korean Patent Application No. 2004-102368, filed on Dec. 7, 2004, the entire contents of which are incorporated herein by reference.

BACKGROUND OF THE INVENTION

1. Field of the Invention

The present invention relates to a printed circuit board for a high-speed semiconductor package and, more particularly, to a printed circuit board having a shield structure for high-speed signal transmission lines.

2. Description of the Related Art

The advance of data transmitting/receiving techniques may incorporate semiconductor products for transmitting high-speed signals, for example of several Gbps (Gigabits per second). Generally, high-speed semiconductor products may be manufactured in a ball grid array (BGA) package type. The BGA package type may require printed circuit boards (PCBs) having a signal transmission line structure. The PCB may provide a mechanical support to integrated circuit (IC) chips and electrical connection paths between IC chips and external devices.

FIG. 1 is a perspective view of a conventional PCB 10 for a high-speed semiconductor package.

Referring to FIG. 1, the PCB 10 may have a dielectric base layer 11, and signal transmission lines 12 formed on one surface of the dielectric base layer 11. Ground patterns 13 may be formed between the signal transmission lines 12 to reduce coupling noises, e.g., crosstalk, between the signal transmission lines 12.

A ground plane 14 may be formed on the other surface of the dielectric base layer 11. Vias 15 may penetrate through the dielectric base layer 11 and connect the ground patterns 13 to the ground plane 14.

The distribution density of the vias 15 may impact high frequency signal transmission characteristics, e.g., as by coupling caused by parallel plate waveguide mode propagation. The distribution density of the vias 15 may increase in proportion to signal transmission speed. The distribution density of the vias 15 may be limited by a number of factors, for example practical minimum diameter of the via 15, separation intervals between the vias 15, and distances between the vias 15 and adjacent ground patterns 13. In the case of through-hole vias, signal transmission line arrangements on the opposite surface may also serve as a limiting factor.

Further, the vias 15 may experience inevitable coupling. The signal transmission lines 12 may have open upper portions, and surface waves may be transmitted to the signal transmission lines 12 along the ground patterns 13. As a result, coupling noises may occur between the signal transmission lines 12.

SUMMARY OF THE INVENTION

An example embodiment of the present invention provides a printed circuit board for a high-speed semiconductor package with reduced likelihood of coupling noises between signal transmission lines.

Another example embodiment of the present invention provides a printed circuit board for high-speed semiconductor package with reduced likelihood of coupling noises caused by surface waves.

According to an example embodiment of the present invention, a PCB for a high-speed semiconductor package may comprise a dielectric base layer, a plurality of signal transmission lines, a plurality of ground patterns, a ground plane, and a plurality of bonding wires. The signal transmission lines may be formed on a first surface of the dielectric base layer. The ground patterns may be formed on the first surface of the dielectric base layer and be arranged between the signal transmission lines. The ground plane may be formed on a second surface of the dielectric base layer. The bonding wires may be formed across the signal transmission lines to connect the ground patterns.

The bonding wires may be regularly arranged at uniform intervals or may be irregularly arranged at non-uniform intervals.

The arrangement of the bonding wires may include a parallel type, a cross type of at least one pair of bonding wires, or a combination of at least two types.

The bonding wires may shield a pair of differential signal transmission lines. The differential signal transmission lines may be in a bent formation.

The bonding wires may be formed of a material selected from Au, Ag, Al, or Cu. The bonding wires may be also formed of an Au alloy containing Cu or Be, or an Au alloy containing Si or Mg.

BRIEF DESCRIPTION OF THE DRAWINGS

The example embodiments of the present invention will be readily understood with reference to the following detailed description thereof provided in conjunction with the accompanying drawings, wherein like reference numerals designate like structural elements in the different drawings figures and may not be described in detail for all drawing FIGS.

Figure 1:
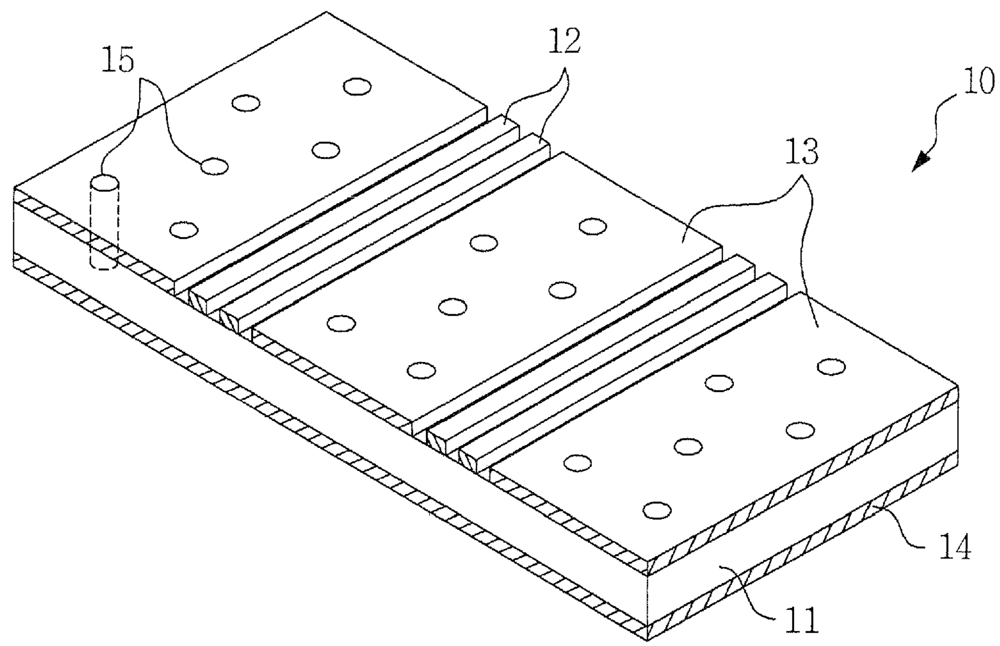
FIG. 1 is a perspective view of a conventional PCB for a high-speed semiconductor package.

These drawings are provided for illustrative purposes only and are not drawn to scale. The spatial relationships and relative sizing of the elements illustrated in the various embodiments may have been reduced, expanded or rearranged to improve the clarity of the figure with respect to the corresponding description. The FIGS., therefore, should not be interpreted as accurately reflecting the relative sizing or positioning of the corresponding structural elements that could be encompassed by an actual device manufactured according to the example embodiments of the invention.

DETAILED DESCRIPTION OF THE INVENTION

Example, non-limiting embodiments of the present invention will now be described more fully hereinafter with reference to the accompanying drawings. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

It should be noted that the figures are intended to illustrate the general characteristics of methods and devices of example embodiments of this invention and support the description of such example embodiments herein. These drawings are not, however, to scale and may not precisely reflect the characteristics of any given embodiment, and should not be interpreted as defining or limiting the range of values or properties of example embodiments within the scope of this invention. Rather, for simplicity and clarity of illustration, the dimensions of some of the elements are exaggerated relative to other elements.

Further, well-known structures and processes are not described or illustrated in detail to avoid obscuring the present invention. Like reference numerals are used for like and corresponding parts of the various drawings, and may not be described in detail for all drawings.

Figure 2A:
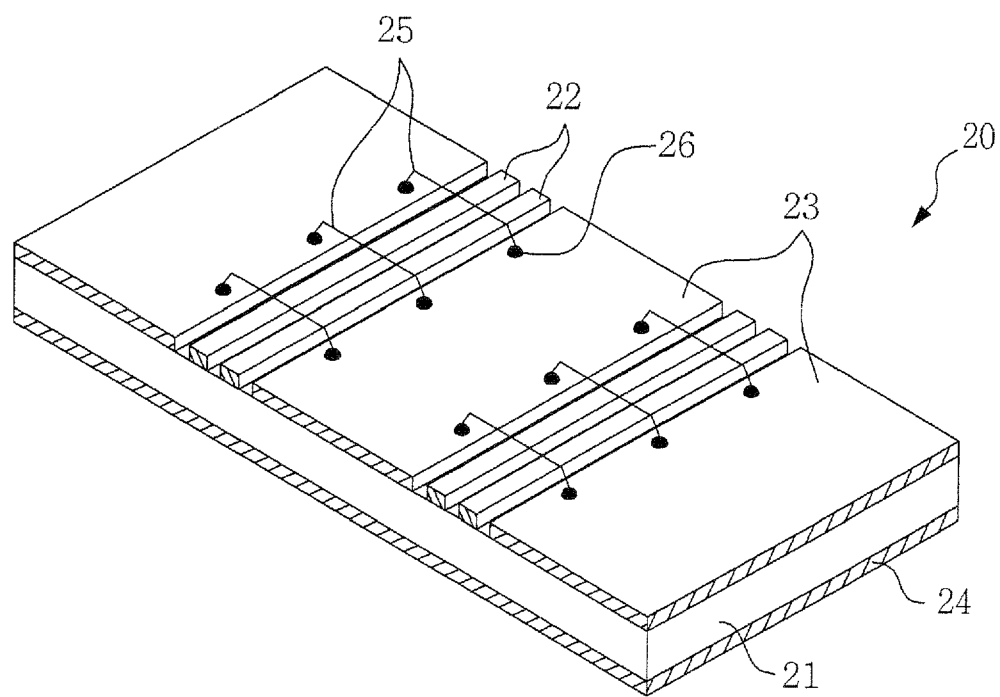
FIG. 2A is a perspective view of a PCB for a high-speed semiconductor package in accordance with an example embodiment of the present invention.
Figure 2B:
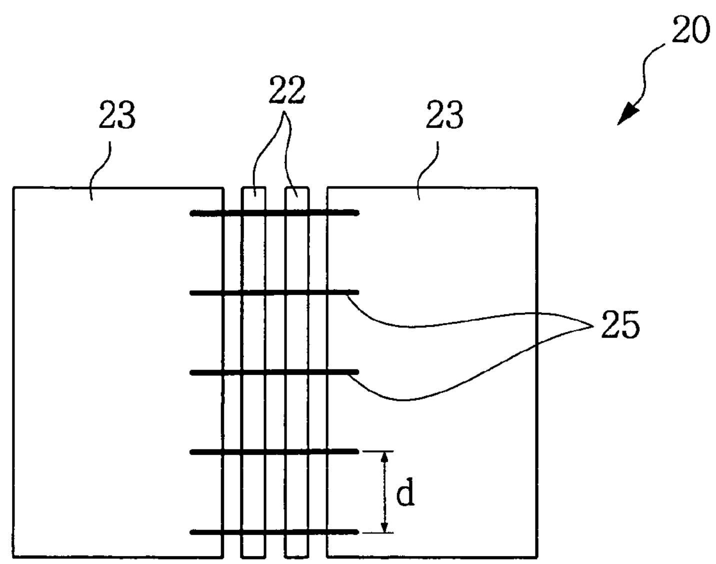
FIG. 2B is a plan view of a PCB for a high-speed semiconductor package in accordance with an example embodiment of the present invention.

FIG. 2A is a perspective view of a PCB 20 for a high-speed semiconductor package in accordance with an example embodiment of the present invention. FIG. 2B is a plan view of a PCB 20 for a high-speed semiconductor package in accordance with an example embodiment of the present invention.

Referring to FIGS. 2A and 2B, the PCB 20 may comprise a dielectric base layer 21 (FIG. 2A), a plurality of signal transmission lines 22 formed on a first surface of the dielectric base layer 21, and a ground plane 24 (FIG. 2A) formed on a second surface of the dielectric base layer 21. A plurality of ground patterns 23 may be formed on the first surface of the dielectric base layer 21. The ground patterns 23 may be arranged between the signal transmission lines 22 to reduce coupling noises, e.g., crosstalk between the signal transmission lines 22.

The dielectric base layer 21 may be formed of an insulating resin including an epoxy, a phenol, a polyimide, or a polyester. The signal transmission lines 22, the ground patterns 23 and the ground plane 24 may be formed of the same or similar metal. The signal transmission lines 22 may include a single signal transmission line or a pair of differential signal transmission lines. The example embodiments of the present invention show a pair of differential signal transmission lines as the signal transmission lines 22. Although not illustrated in drawings, another insulating layer and another conductive layer may be formed outside the ground plane 24 to form a multi-layered PCB 20.

The PCB 20 may further comprise a plurality of bonding wires 25 to shield the signal transmission lines 22. The bonding wires 25 may connect the ground patterns 23 adjacent to the signal transmission lines 22. The bonding wires 25 may pass over the signal transmission lines 22, e.g., to shield an open upper portion of the signal transmission lines 22. Bonding wires 25, instead of vias, contribute to the shield structure. The bonding wires 25 may reduce the likelihood of coupling noises caused by surface waves, e.g., transmitted to the signal transmission lines 22 along the ground patterns 23.

The bonding wires 25 may be regularly arranged at uniform intervals in the transmission direction of the signal transmission lines 22. The bonding wires 25 may be arranged parallel to each other. In this case, as shown in FIG. 2B, the distance (d) between adjacent bonding wires 25 may determine the shielding efficiency. The distance (d) between the bonding wires 25 may be reduced as the speed of signal transmission increases. A modern wire bonding technique may set the distance (d) between the bonding wires to about 60 μm.

The bonding wires 25 may be formed of a material selected from Au, Ag, Al, or Cu. Au wires may use an alloy containing Cu or Be. Al wires may use an alloy containing Si or Mg. The diameter of the bonding wire 25 may be between 10 μm and 50 μm.

A wire bonding process may include a thermocompression method, an ultrasonic method using pressure and ultrasonic vibration, or a thermosonic method using temperature, pressure and ultrasonic vibration. The thermocompression method may apply a force of 1N at a temperature of 300° C. to 350° C. for 20 ms to 50 ms. The ultrasonic method may apply an ultrasonic vibration of about 60 KHz at a normal temperature. The thermosonic method may reduce the temperature required in the wire bonding process to around 150° C. by combining the thermocompression method and the ultramosonic method. Connection portions 26 of the bonding wire 25 and the ground patterns 23 may be formed in a ball-ball type, a ball-wedge type, or a wedge-wedge type.

The bonding wires 25 may be arranged in various layouts. FIG. 3A through 3D are plan views illustrating various shield structures of a PCB 20 for a high-speed semiconductor package.

Figure 3A:
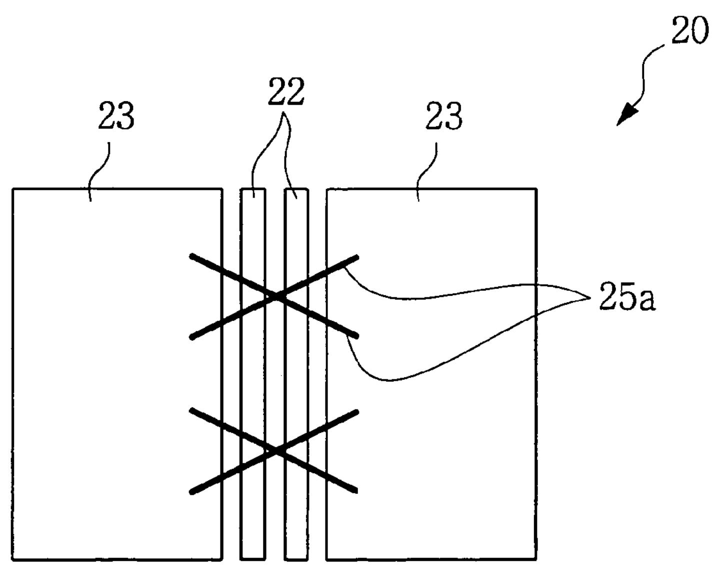
FIGS. 3A, 3B, 3C, and 3D are plan views illustrating various shield structures of a PCB for a high-speed semiconductor package.
Figure 3B:
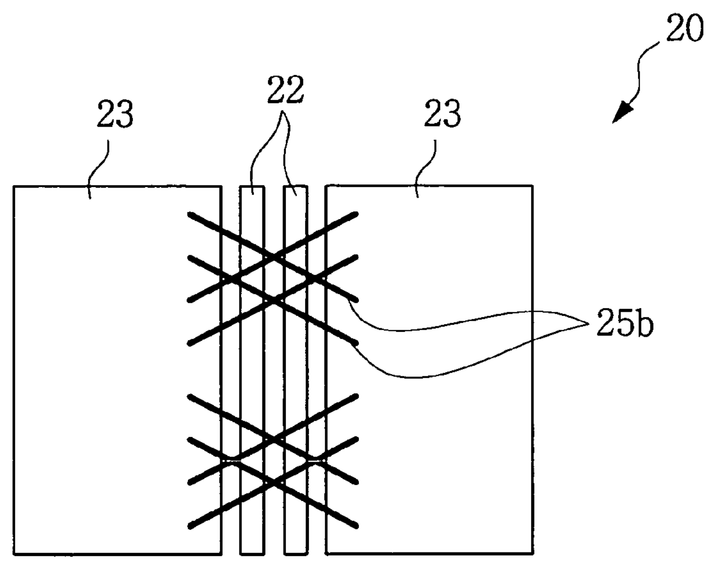

As shown in FIG. 3A, bonding wires **25*a* may be arranged as a crossed pair of the bonding wires 25*a*. As shown in FIG. 3B, bonding wires 25*b* may be arranged as two crossed pairs of the bonding wires 25*b***.

Figure 3C:
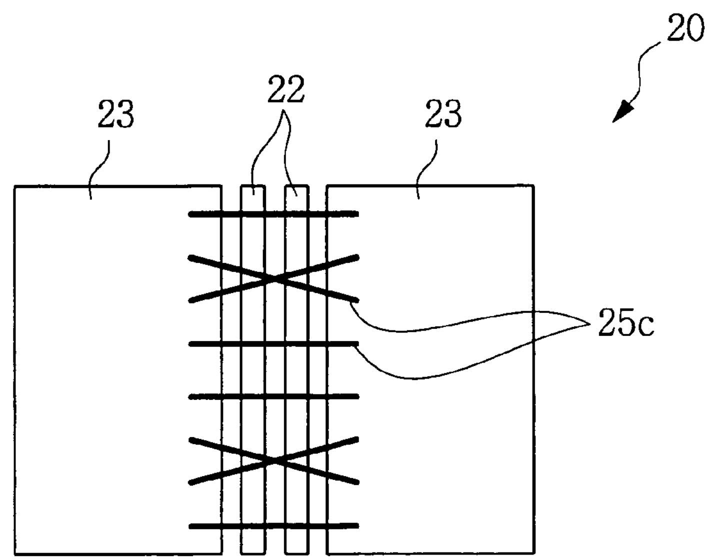
Figure 3D:
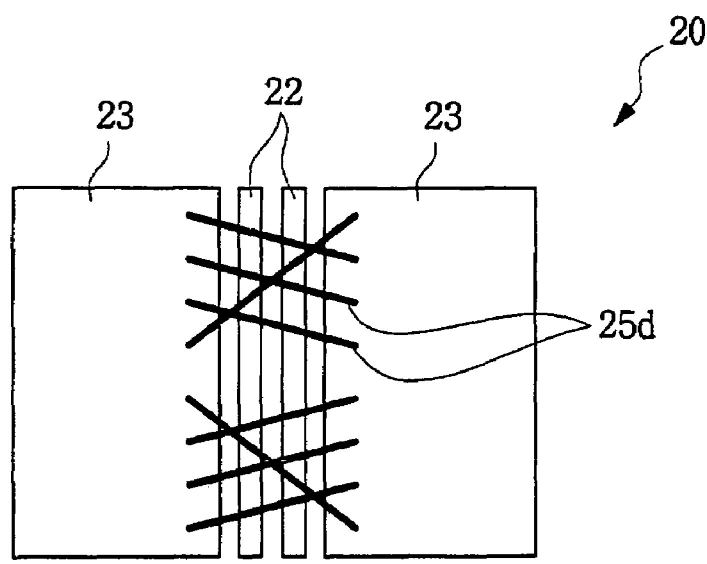

The bonding wires may be arranged in a combination of at least two types. As shown in FIG. 3C, for example, bonding wires **25*c* may be regularly arranged in uniform intervals. As shown in FIG. 3D, however, bonding wires 25*d*** may be irregularly arranged in non-uniform intervals. The various arrangements of the bonding wires disclosed as example embodiments, and need not be limited in this regard.

Figure 4:
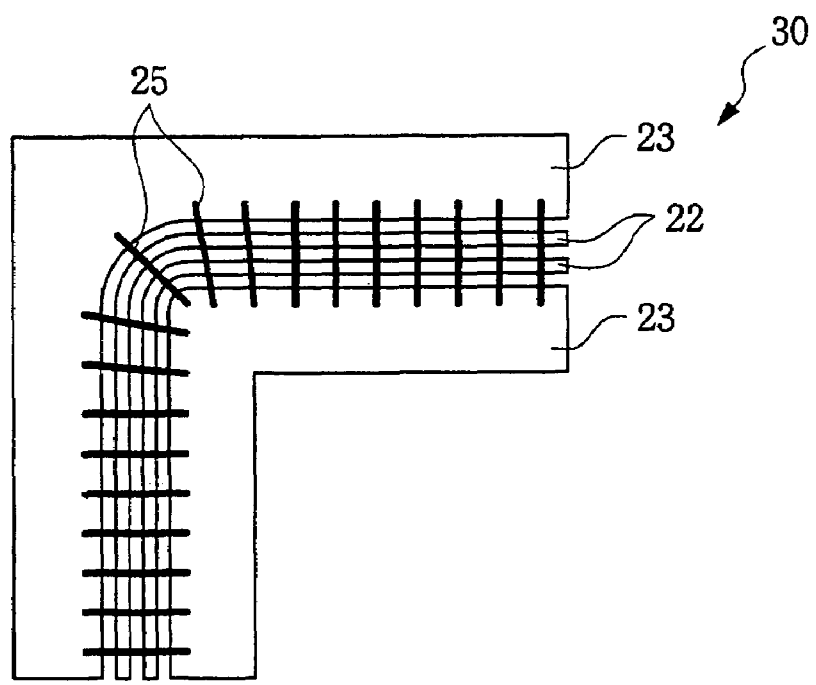
FIG. 4 is a plan view of a PCB for a high-speed semiconductor package in accordance with another example embodiment of the present invention.

FIG. 4 is a plan view of a PCB 30 for a high-speed semiconductor package in accordance with another example embodiment of the present invention.

Referring to FIG. 4, signal transmission lines 22 may be in a bent formation. In this case, a radiation loss may occur due to a surface wave mode excitation. The use of bonding wires 25 according to some embodiments of the present invention may reduce the radiation loss.

As may be appreciated, the ground plate 24 would have an electrical connection (not shown) to ground potential, as would the various ground patterns 23.

In accordance with example embodiments of the present invention, a PCB of a high-speed semiconductor package may use bonding wires to form a shield structure to shield, for example, an open upper portion of signal transmission lines. The bonding wires may reduce the likelihood of coupling noises caused by surface waves, e.g., transmitted to signal transmission lines along ground patterns.

The shield structure using bonding wires formed by a known wire bonding process, e.g., as in that of a semiconductor package assembly process, reduces manufacturing cost and time.

Although example, non-limiting embodiments of the present invention have been described in detail hereinabove, it should be understood that many variations and/or modifications of the basic inventive concepts herein taught, which may appear to those skilled in the art, will still fall within the spirit and scope of the present invention.

What is claimed is:

1. A printed circuit board for a high-speed semiconductor package, the printed circuit board comprising:

a dielectric base layer;

a plurality of signal transmission lines on a first surface of the dielectric base layer;

a plurality of ground patterns on the first surface of the dielectric base layer and arranged in relation to the plurality of signal transmission lines;

a ground plane on a second surface of the dielectric base layer; and a plurality of bonding wires electrically connecting selected portions of the plurality of ground patterns across the plurality of signal transmission lines, the plurality of bonding wires arranged to shield the plurality of signal transmission lines, wherein each of the plurality of bonding wires includes elongated wires bonded to the respective ground patterns with connection portions, the connection portions including at least one of a ball-ball type, a ball-wedge type, or a wedge-wedge type.

2. The printed circuit board of claim 1, wherein the plurality of bonding wires are regularly arranged at selected intervals along a transmission direction of the plurality of signal transmission lines.

3. The printed circuit board of claim 1, wherein the plurality of bonding wires are irregularly arranged at non-uniform intervals along a transmission direction of the plurality of signal transmission lines.

4. The printed circuit board of claim 1, wherein at least two of the plurality of bonding wires are arranged in parallel relation.

5. The printed circuit board of claim 1, wherein at least two of the plurality of bonding wires are arranged in crossed pair relation.

6. The printed circuit board of claim 1, wherein the plurality of bonding wires are arranged in a combination including at least two bonding wires in parallel relation and including at least two bonding wires in crossed pair relation.

7. The printed circuit board of claim 1, wherein the plurality of bonding wires are arranged to shield the plurality of signal transmission lines from coupling noises caused by surface waves transmitted along at least a portion of the plurality of ground patterns.

8. The printed circuit board of claim 1, wherein the plurality of signal transmission lines are in a bent formation in the vicinity of the plurality of bonding wires.

9. The printed circuit board of claim 1, wherein the plurality of bonding wires comprise a material chosen from Au, Ag, Al, and Cu.

10. The printed circuit board of claim 1, wherein the plurality of bonding wires comprise an Au alloy containing Cu or Be.

11. The printed circuit board of claim 1, wherein the plurality of bonding wires comprise an Al alloy containing Si or Mg.

12. A method of manufacturing a high-speed semiconductor package, the method comprising:

forming a circuit board including a transmission line, a first conductive plate on a first side of the transmission line, and a second conductive plate on a second side of the transmission line; and electrically coupling the first and second conductive plates with a plurality of bonding wires across the transmission line by bonding the bonding wires to the first and second conductive plates using one of a thermocompression method or a thermosonic method, the plurality of bonding wires arranged to shield the transmission line.

13. The method according to claim 12 wherein forming a circuit board further comprises forming the first conductive plate and the second conductive plate at a first surface of a dielectric substrate.

14. The method according to claim 13 wherein forming a circuit board further comprises forming a third conductive plate on a second surface of the dielectric substrate.

15. The method according to claim 12 wherein electrically coupling comprises coupling the first and second conductive plates at portions selected in relation to a feature or property of the transmission line.

16. The method according to claim 15 wherein the feature or property of the transmission line includes at least one of a bending transmission line formation or a parallel transmission line formation.

17. The method according to claim 12 wherein electrically coupling comprises coupling corresponding portions of the first and second conductive plates with the plurality of bonding wires.

18. The method according to claim 17 wherein the corresponding portions are selected to establish a selected spatial relation between the corresponding bonding wire and the transmission line.

19. The method according to claim 18 wherein the spatial relation is an oblique angular relation.

20. The method according to claim 18 wherein the spatial relation is an orthogonal angular relation.

21. The method according to claim 18 wherein the spatial relation is an interval spacing between bonding wires along a length section of the transmission line.

22. The method according to claim 21 wherein the interval spacing is selected in relation to an expected signal frequency of the transmission line.

23. In a high-speed semiconductor package having transmission a line, a shield structure comprising:

a first conductive plate on a first side of the transmission line;

a second conductive plate on a second side of the transmission line; and a plurality of bonding wires, each bonding wire thereof electrically coupling a corresponding selected portion of the first conductive plate to a corresponding selected portion of the second conductive plate, wherein a spacing between selected ones of the plurality of bonding wires is selected in relation to an expected signal transmission speed.

24. A shield structure according to claim 23 further comprising a third conductive plate in parallel relation to the first and second conductive plates.

25. A shield structure according to claim 24 further comprising a dielectric substrate, the first and second conductive plates being at a first surface of the dielectric substrate, the third conductive plate being at a second surface of the dielectric substrate.

26. A shield structure according to claim 23 wherein the selected portion of the first conductive plate and the selected portion of the second conductive plate lie in opposition across the transmission line.

27. A shield structure according to claim 23 wherein at least one pair of bonding wires, taken from the plurality of bonding wires, lies in substantially parallel relation.

28. A shield structure according to claim 27 wherein the at least one pair of bonding wires lies in oblique relation to the transmission line.

29. A shield structure according to claim 27 wherein the at least one pair of bonding wires lies in orthogonal relation to the transmission line.

30. A printed circuit board for a high-speed semiconductor package, the printed circuit board comprising:

a dielectric base layer;

a first signal transmission line arranged on a first surface of the dielectric base layer;

a second signal transmission line arranged on the first surface of the dielectric base layer;

a plurality of ground patterns arranged on the first surface of the dielectric base layer, wherein at least one of the plurality of ground patterns is arranged to be between the first signal transmission line and the second signal transmission line;

a ground plane arranged on a second surface of the dielectric base layer;

a first plurality of bonding wires electrically connecting selected portions of the plurality of ground patterns and arranged across the first signal transmission line, wherein a spacing between selected ones of the plurality of the first bonding wires is selected in relation to an expected signal transmission speed for the first signal transmission line; and a second plurality of bonding wires electrically connecting selected portions of the plurality of ground patterns and arranged across the second signal transmission line, wherein a spacing between selected ones of the plurality of the second bonding wires is selected in relation to an expected signal transmission speed for the second signal transmission line.

31. The printed circuit board of claim 30, wherein the first signal transmission line is substantially parallel to the second signal transmission line.

32. The printed circuit board of claim 31, wherein the first signal transmission line comprises a first pair of differential signal transmission lines, and wherein the second signal transmission line comprises a second pair of differential signal transmission lines.

* * * * *